(12) United States Patent
Zhu et al.

(10) Patent No.: US 11,961,926 B2
(45) Date of Patent: Apr. 16, 2024

(54) METHOD FOR METALLIZING FRONT ELECTRODE OF N-TYPE SOLAR CELL

(71) Applicant: NANTONG T-SUN NEW ENERGY CO., LTD., Jiangsu (CN)

(72) Inventors: Peng Zhu, Jiangsu (CN); Yuan Liu, Jiangsu (CN); Mengxue Liu, Jiangsu (CN)

(73) Assignee: NANTONG T-SUN NEW ENERGY CO., LTD., Jiangsu (CN)

( * ) Notice: Subject to any disclaimer, the term of this patent is extended or adjusted under 35 U.S.C. 154(b) by 154 days.

(21) Appl. No.: 17/440,192

(22) PCT Filed: May 13, 2019

(86) PCT No.: PCT/CN2019/086560
§ 371 (c)(1),
(2) Date: Sep. 17, 2021

(87) PCT Pub. No.: WO2020/220392
PCT Pub. Date: Nov. 5, 2020

(65) Prior Publication Data
US 2022/0158004 A1    May 19, 2022

(30) Foreign Application Priority Data

Apr. 29, 2019  (CN) .......................... 201910354176.X

(51) Int. Cl.
*H01L 31/0224* (2006.01)
*H01L 31/0216* (2014.01)

(52) U.S. Cl.
CPC .. *H01L 31/02245* (2013.01); *H01L 31/02168* (2013.01)

(58) Field of Classification Search
CPC ... H01L 31/068; H01L 31/18; H01L 31/1804; H01L 31/022425; H01L 31/02168; H01L 31/02245
See application file for complete search history.

(56) References Cited

U.S. PATENT DOCUMENTS

2003/0178057 A1* 9/2003 Fujii ............... H01L 31/022425
                                                          136/246
2012/0192932 A1* 8/2012 Wu ................. H01L 31/022425
                                                          136/252

(Continued)

FOREIGN PATENT DOCUMENTS

CN    102479883    5/2012
CN    102738301    10/2012

(Continued)

OTHER PUBLICATIONS

KR-2015060412-A English machine translation (Year: 2015).*

(Continued)

*Primary Examiner* — Andrew J Golden
(74) *Attorney, Agent, or Firm* — JCIP GLOBAL INC.

(57) ABSTRACT

The present invention relates to a method for metallizing a front electrode of an N-type solar cell, including: treating an N-type crystalline silicon substrate to form a $p^+$ doped region and a front surface passivation anti-reflection coating on a front surface of the N-type crystalline silicon substrate in an inside-out sequence, printing an aluminum paste on the front surface passivation anti-reflection coating to form a first finger, overprinting a silver paste on the first finger to form a second finger, and printing a front silver paste on the first finger to form a busbar. In the present invention, the superposition of the second finger on the first finger can reduce line resistance while ensuring a good ohmic contact, which further improves the photoelectric conversion effi- (Continued)

ciency of solar cells. Moreover, since no grooving procedure is required, the process is simplified and cost-efficient.

7 Claims, 1 Drawing Sheet

(56) References Cited

U.S. PATENT DOCUMENTS

| | | | | |
|---|---|---|---|---|
| 2012/0258561 | A1* | 10/2012 | Li | H01L 31/1804 438/96 |
| 2013/0000716 | A1* | 1/2013 | Zhang | H01L 31/022425 257/E31.124 |
| 2015/0072463 | A1* | 3/2015 | Yang | H01L 31/068 438/72 |

FOREIGN PATENT DOCUMENTS

| | | | | |
|---|---|---|---|---|
| CN | 102945866 | | 2/2013 | |
| CN | 105742378 | | 7/2016 | |
| CN | 107968127 | | 4/2018 | |
| CN | 109585578 | | 4/2019 | |
| JP | 2014057028 | A * | 3/2014 | ..... H01L 31/022433 |
| KR | 2010131203 | A * | 12/2010 | |
| KR | 2015060412 | A * | 6/2015 | |
| WO | WO-2017018300 | A1 * | 2/2017 | ........... H01L 31/068 |

OTHER PUBLICATIONS

CN 105742378A English machine translation (Year: 2016).*
WO-2017018300-A1 English machine translation (Year: 2017).*
CN 102945866A English machine translation (Year: 2013).*
JP-2014057028-A English machine translation (Year: 2014).*
KR-2010131203-A English machine translation (Year: 2010).*
"International Search Report (Form PCT/ISA/210)" of PCT/CN2019/086560, with English translation thereof, dated Jan. 23, 2020, pp. 1-5.

* cited by examiner

METHOD FOR METALLIZING FRONT ELECTRODE OF N-TYPE SOLAR CELL

CROSS-REFERENCE TO RELATED APPLICATION

This application is a 371 of international application of PCT application serial no. PCT/CN2019/086560, filed on May 13, 2019, which claims the priority benefit of China application no. 201910354176.X, filed on Apr. 29, 2019. The entirety of each of the above mentioned patent applications is hereby incorporated by reference herein and made a part of this specification.

BACKGROUND

Technical Field

The present invention relates to the field of solar cells, and in particular to a method for metallizing a front electrode of an N-type solar cell.

Description of Related Art

With the continuous development of solar cells, solar cell paste with high efficiency, good stability and cost-efficiency becomes a mainstream product pursued by the solar cell market. The N-type solar cell is becoming more and more popular in the market due to its advantages such as high conversion efficiency, less light-induced degradation, good stability and cost-efficiency, as well as superiorities of double-sided power generation and suitability for building integration and vertical installation. Therefore, the application of the N-type solar cell is of increasing interest in the market.

In the most common N-type solar cell, on the front is a $p^+$ doped layer, the substrate is formed from N-type silicon, and on the rear side is an $n^+$ doped layer. For metallization of the solar cell, a double-sided H-shaped metal finger structure is typically employed; an aluminum-doped silver paste is printed on the $p^+$ side, and a silver paste is printed on the $n^+$ side. The two reasons for using the aluminum-doped silver paste on the $p^+$ side is: 1) to form a good ohmic contact (in terms of the $p^+$ doped surface, trivalent aluminum ion and $p^+$ doped silicon may have a lower contact resistance, which is higher for a pure silver paste), and 2) to meet the welding requirement (as the battery plate must be welded during the assembly process, the metal electrode must meet the requirement of weldability; conventional tin-containing welding strips can be firmly welded to silver, but cannot be well welded on the surface of aluminum).

Therefore, in order to meet the requirements of the ohmic contact and welding performance, an aluminum-doped silver paste is typically applied on the $p^+$ surface. However, the aluminum-doped silver paste features a high silver content, resulting in a cost comparable to that of a pure silver paste. Currently, there are few methods for metallizing $p^+$ doped surfaces, which can greatly reduce the use of silver with low ohmic contact resistance and excellent weldability still satisfied.

Chinese Patent No. CN201610231739.2 discloses a method for metallizing an N-type solar cell, the cell, an assembly and a system. The technical scheme of the patent includes: treating an N-type crystalline silicon substrate to form a $p^+$ doped region and a front surface passivation anti-reflection coating on a front surface of the N-type crystalline silicon substrate in an inside-out sequence; forming an $n^+$ doped region and a rear surface passivation coating on a rear surface of the N-type crystalline silicon substrate in an inside-out sequence; forming a groove-shaped structure penetrating through the passivation anti-reflection coating on the front surface of the N-type crystalline silicon substrate, and printing a back electrode on the rear surface of the N-type crystalline silicon substrate with a silver paste; and printing an aluminum paste on the groove-shaped structure to form a front finger, printing an aluminum-doped silver paste or a silver paste to form a front busbar, and sintering the resultant substrate to give the N-type solar cell. According to that invention, the front surface passivation anti-reflection coating is grooved before printing the front paste, leading to a complicated process. If the grooving is performed by laser processing, additional technical devices are required, resulting in an increased cost of production. Fingers formed from the aluminum paste have higher resultant line resistances and lower photoelectric conversion efficiencies.

SUMMARY

Purpose: In order to solve the defects in the prior art, the present invention provides a method for metallizing a front electrode of an N-type solar cell. The method reduces the cost by reducing the amount of front silver paste, improves the photoelectric conversion efficiency by reducing the line resistance of the fingers, and saves equipment and labor without adding procedures.

Technical Scheme: The present invention provides a method for metallizing a front electrode of an N-type solar cell, including:

(1) preparing an N-type double-sided cell including an N-type crystalline silicon substrate before metallization, and forming a $p^+$ doped region and a front surface passivation anti-reflection coating on a front surface of the N-type crystalline silicon substrate in an inside-out sequence; and forming an $n^+$ doped region and a rear surface passivation coating on a rear surface of the N-type crystalline silicon substrate in an inside-out sequence; and (2) printing an aluminum paste on the front surface passivation anti-reflection coating to form a first finger, overprinting a silver paste on the first finger to form a second finger, and printing a front silver paste on the first finger to form a busbar.

In one embodiment of the present invention, the passivation anti-reflection coating on the front surface of the N-type crystalline silicon substrate includes one or more of $SiO_2$, $SiN_x$, or $Al_2O_3$ dielectric coatings, and the rear surface passivation coating is a composite dielectric coating consisting of $SiO_2$ and $SiN_x$ dielectric coatings; the N-type crystalline silicon substrate has a thickness of 50-300 µm; the $p^+$ doped region has a doping depth of 0.5-2.0 µm; the front surface passivation anti-reflection coating has a thickness of 70-110 nm; the rear surface passivation coating has a thickness of no less than 20 nm; the $n^+$ doped region has a doping depth of 0.5-2.0 µm.

In one embodiment of the present invention, the first finger has a width of 20-45 µm and a height of 10-20 µm, and the distance between two adjacent first fingers is 0.8-1.5 mm.

In one embodiment of the present invention, the second finger has a width of 35-40 µm and a height of 5-10 µm, and the distance between two adjacent second fingers is 1-1.5 mm.

In one embodiment of the present invention, the busbar has a width of 0.5-3 mm and a height of 5-10 mm.

In one embodiment of the present invention, the front surface passivation anti-reflection coating is printed with the aluminum paste, dried at 200-300° C. for 2-5 min and sintered at a sintering peak temperature of 550-780° C. for 8-15 s to form the first finger; the first finger is overprinted with a low temperature-curing silver paste, dried at 100-200° C. for 5-10 min and cured at 150-250° C. for 3-5 min to form the second finger.

In one embodiment of the present invention, the front surface passivation anti-reflection coating is printed with the aluminum paste, dried at 200-300° C. for 2-5 min and sintered at a sintering peak temperature of 550-780° C. for 8-15 s to form the first finger; the first finger is overprinted with a low-to-medium temperature-curing silver paste, dried at 200-300° C. for 2-5 min and sintered at 300-500° C. for 8-15 min to form the second finger.

In one embodiment of the present invention, the front surface passivation anti-reflection coating is printed with the aluminum paste and dried at 200-300° C. for 2-5 min to form the first finger; the first finger is overprinted with a medium-to-high temperature-sintering silver paste, dried at 200-300° C. for 2-5 min and sintered at a sintering peak temperature of 700-780° C. for 8-15 min to form the second finger.

In one embodiment of the present invention, the printed front silver paste for forming the busbar is selected from one of the low temperature-curing silver paste, the low-to-medium temperature-sintering silver paste and the high temperature-sintering silver paste.

In one embodiment of the present invention, the printed front silver paste for forming the busbar and the printed front silver paste for forming the second finger may vary.

Beneficial Effects: The present invention has the following advantages:

1. According to the method of the present invention, fingers are applied through two printing procedures. The first finger is formed by aluminum paste printing, which reduces the high cost of a conventional silver paste printing procedure while forming a good ohmic contact; the superposition of the second finger on the first finger can reduce line resistance while ensuring a good ohmic contact, which further improves the photoelectric conversion efficiency of solar cells.

2. The method of the present invention eliminates the need for a grooving procedure prior to finger printing; the aluminum paste used is a front corrosive aluminum paste, which is capable of forming conductive fingers and corroding the front surface passivation anti-reflection coating of the solar cell during the sintering procedure; the method requires no additional procedures and equipment, greatly saves the production costs, and can be well incorporated by existing production lines.

Figure 1:
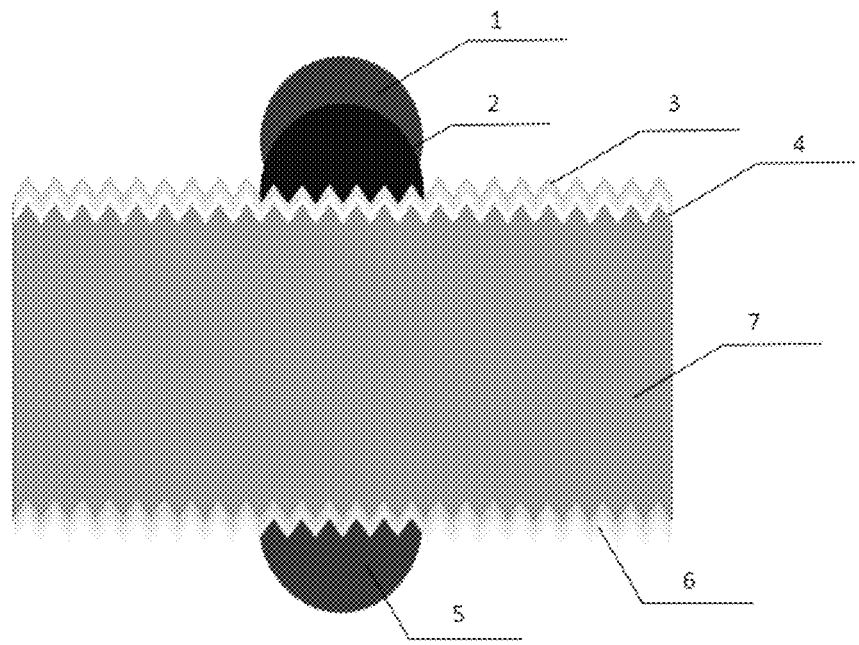
FIG. 1 is a schematic cross-sectional view of a solar cell prepared according to the method for metallizing a front electrode of an N-type solar cell disclosed herein.
Figure 2:
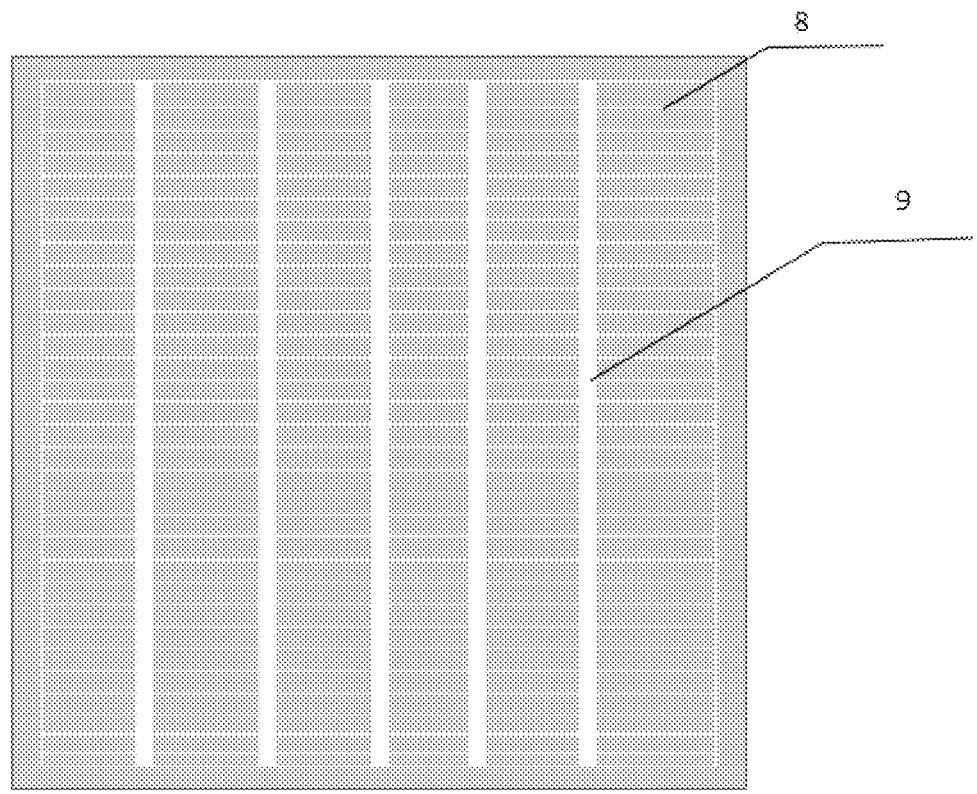
FIG. 2 is a schematic front view of a solar cell prepared using the method for metallizing a front electrode of an N-type solar cell disclosed herein.

1—second finger; 2—first finger; 3—front surface passivation anti-reflection coating; 4—$p^+$ doped region; 5—rear-side silver paste; 6—$n^+$ doped region; 7—N-type crystalline silicon substrate; 8—finger; 9—busbar.

DESCRIPTION OF THE EMBODIMENTS

The technical schemes in the embodiments of the present invention will be clearly and completely described below, for a better understanding of the advantages and features of the present invention by those skilled in the art, and for a more the clearly defined protection scope of the present invention. The described embodiments are only some, but not all, embodiments of the invention. Based on the embodiments of the present invention, all other embodiments obtained by those of ordinary skill in the art without making any creative effort will fall within the protection scope of the present invention.

Example 1

Provided is a method for metallizing a front electrode of an N-type solar cell, including the following specific steps:

An N-type double-sided cell including an N-type crystalline silicon substrate 7 was first prepared before metallization, a front surface of the N-type crystalline silicon substrate 7 including a $p^+$ doped region 4 and a front surface passivation anti-reflection coating 3 in an inside-out sequence; and a rear surface of the N-type crystalline silicon substrate 7 including an $n^+$ doped region 6 and a rear surface passivation coating in an inside-out sequence. The front surface passivation anti-reflection coating included one or more of $SiO_2$, $SiN_x$, and $Al_2O_3$ dielectric coatings, and the rear surface passivation coating was a composite dielectric coating consisting of $SiO_2$ and $SiN_x$ dielectric coatings. The N-type crystalline silicon substrate 7 had a thickness of 50-300 µm; the $p^+$ doping region 4 had a doping depth of 0.5-2.0 µm; the front surface passivation anti-reflection coating 3 had a thickness of 70-110 nm; the rear surface passivation coating had a thickness of no less than 20 nm; the $n^+$ doping region 6 had a doping depth of 0.5-2.0 µm.

On the rear surface of the N-type crystalline silicon substrate 7, the electrode was printed with a silver paste and dried with a pattern of H-shaped grid lines, wherein 5 rear-side busbars 9 having a width of 0.5-3 mm and a length of 154 mm were arranged equidistantly; 100 rear-side fingers having a width of 20-60 µm and a length of 154 mm were arranged in parallel at an interval of 1.55 mm.

On the front surface of the N-type crystalline silicon substrate 7, the first finger 2 was printed with a corrosive aluminum paste, dried at 250° C. for 3 min, and sintered at a sintering peak temperature of 650° C. for 11 s to form the first finger 2. The first finger 2 had a width of 33 µm and a height of 15 µm, and 80 first fingers 2 were arranged with an interval of 1.15 mm between two adjacent first fingers 2.

The first finger 2 on the front surface of the N-type crystalline silicon substrate 7 was overprinted with a low temperature-curing silver paste, dried at 150° C. for 8 min, and cured at 200° C. for 4 min to form the second finger 1. The second finger 1 had a width of 40 µm, a height of 7 µm, and an interval of 1.15 mm between two adjacent second fingers 1. At the same time, the front busbar 9 was printed with a low temperature-curing silver paste, dried and cured. 5 front busbars 9 having a width of 1.75 mm and a height of 7.5 µm were arranged equidistantly.

Example 2

Provided is a method for metallizing a front electrode of an N-type solar cell, including the following specific steps:

An N-type double-sided cell including an N-type crystalline silicon substrate 7 was first prepared before metallization, a front surface of the N-type crystalline silicon substrate 7 including a $p^+$ doped region 4 and a front surface passivation anti-reflection coating 3 in an inside-out sequence; and a rear surface of the N-type crystalline silicon substrate 7 including an n⁺ doped region 6 and a rear surface passivation coating in an inside-out sequence. The front surface passivation anti-reflection coating included one or more of $SiO_2$, $SiN_x$, and $Al_2O_3$ dielectric coatings, and the rear surface passivation coating was a composite dielectric coating consisting of $SiO_2$ and $SiN_x$ dielectric coatings. The N-type crystalline silicon substrate 7 had a thickness of 50-300 μm; the p⁺ doping region 4 had a doping depth of 0.5-2.0 μm; the front surface passivation anti-reflection coating 3 had a thickness of 70-110 nm; the rear surface passivation coating had a thickness of no less than 20 nm; the n⁺ doping region 6 had a doping depth of 0.5-2.0 μm.

On the rear surface of the N-type crystalline silicon substrate 7, the electrode was printed with a silver paste and dried with a pattern of H-shaped grid lines, wherein 5 rear-side busbars 9 having a width of 0.5-3 mm and a length of 154 mm were arranged equidistantly; 100 rear-side fingers having a width of 20-60 μm and a length of 154 mm were arranged in parallel at an interval of 1.55 mm.

On the front surface of the N-type crystalline silicon substrate 7, the first finger 2 was printed with a corrosive aluminum paste, dried at 200° C. for 5 min, and sintered at a sintering peak temperature of 550° C. for 15 s to form the first finger 2. The first finger 2 had a width of 20 μm and a height of 10 μm, and 80 first fingers 2 were arranged with an interval of 0.8 mm between two adjacent first fingers 2.

The first finger 2 on the front surface of the N-type crystalline silicon substrate 7 was overprinted with a low temperature-curing silver paste and a low-to-medium temperature-curing silver paste, dried at 200-300° C. for 2-5 min, and sintered at 300° C. for 15 min to form the second finger 1. The second finger 1 had a width of 30 μm, a height of 5 μm, and an interval of 0.8 mm between two adjacent second fingers 1. At the same time, the front busbar 9 was printed with a medium-to-low temperature-curing silver paste, dried and sintered. 5 front busbars 9 having a width of 0.5 mm and a height of 5 μm were arranged equidistantly.

Example 3

Provided is a method for metallizing a front electrode of an N-type solar cell, including the following specific steps:

An N-type double-sided cell including an N-type crystalline silicon substrate 7 was first prepared before metallization, a front surface of the N-type crystalline silicon substrate 7 including a p⁺ doped region 4 and a front surface passivation anti-reflection coating 3 in an inside-out sequence; and a rear surface of the N-type crystalline silicon substrate 7 including an n⁺ doped region 6 and a rear surface passivation coating in an inside-out sequence. The front surface passivation anti-reflection coating included one or more of $SiO_2$, $SiN_x$, and $Al_2O_3$ dielectric coatings, and the rear surface passivation coating was a composite dielectric coating consisting of $SiO_2$ and $SiN_x$ dielectric coatings. The N-type crystalline silicon substrate 7 had a thickness of 50-300 μm; the p⁺ doping region 4 had a doping depth of 0.5-2.0 μm; the front surface passivation anti-reflection coating 3 had a thickness of 70-110 nm; the rear surface passivation coating had a thickness of no less than 20 nm; the n⁺ doping region 6 had a doping depth of 0.5-2.0 μm.

On the rear surface of the N-type crystalline silicon substrate 7, the electrode was printed with a silver paste and dried with a pattern of H-shaped grid lines, wherein 5 rear-side busbars 9 having a width of 0.5-3 mm and a length of 154 mm were arranged equidistantly; 100 rear-side fingers having a width of 20-60 μm and a length of 154 mm were arranged in parallel at an interval of 1.55 mm.

On the front surface of the N-type crystalline silicon substrate 7, the first finger 2 was printed with a corrosive aluminum paste and dried at 300° C. to form the first finger 2. The first finger 2 had a width of 45 μm and a height of 20 μm, and 80 first fingers 2 were arranged with an interval of 1.5 mm between two adjacent first fingers 2.

The first finger 2 on the front surface of the N-type crystalline silicon substrate 7 was overprinted with a medium-to-high temperature-sintering silver paste, dried at 300° C. for 2 min, and sintered at a sintering peak temperature of 780° C. for 8 min to form the second finger 1. The second finger 1 had a width of 50 μm, a height of 10 μm, and an interval of 1.5 mm between two adjacent second fingers 1. At the same time, the front busbar 9 was printed with a low-to-medium temperature-curing silver paste, dried and sintered. 5 front busbars 9 having a width of 0.5 mm and a height of 5 μm were arranged equidistantly.

Comparative Example

An N-type double-sided cell including an N-type crystalline silicon substrate 7 was prepared before metallization, a front surface of the N-type crystalline silicon substrate 7 including a p⁺ doped region 4 and a front surface passivation anti-reflection coating 3 in an inside-out sequence; and a rear surface of the N-type crystalline silicon substrate 7 including an n⁺ doped region 6 and a rear surface passivation coating in an inside-out sequence. The front surface passivation anti-reflection coating included one or more of $SiO_2$, $SiN_x$, and $Al_2O_3$ dielectric coatings, and the rear surface passivation coating was a composite dielectric coating consisting of $SiO_2$ and $SiN_x$ dielectric coatings. The N-type crystalline silicon substrate 7 had a thickness of 50-300 μm; the p⁺ doping region 4 had a doping depth of 0.5-2.0 μm; the front surface passivation anti-reflection coating 3 had a thickness of 70-110 nm; the rear surface passivation coating had a thickness of no less than 20 nm; the n⁺ doping region 6 had a doping depth of 0.5-2.0 μm.

A groove-shaped structure was formed on the front surface passivation anti-reflection coating by using a laser to ensure that the groove-shaped structure completely penetrated through the passivation anti-reflection coating. The groove-shaped structure is a continuous linear structure with a width of 20-60 μm and a length of 154 mm. A total of 80 continuous lines were arranged in parallel at an interval of 1.95 mm.

On the rear surface of the N-type crystalline silicon substrate 7, the electrode was printed with a silver paste and dried with a pattern of H-shaped grid lines, wherein 5 rear-side busbars 9 having a width of 0.5-3 mm and a length of 154 mm were arranged equidistantly; 100 rear-side fingers having a width of 20-60 μm and a length of 154 mm were arranged in parallel at an interval of 1.55 mm.

On the front surface of the N-type crystalline silicon substrate 7, the front finger was printed with aluminum paste and dried. 80 front fingers having a width of 20-60 μm and a length of 154 mm were arranged in parallel at an interval of 1.95 mm. The printed front fingers must completely match with the grooving pattern at printing.

On the front surface of the N-type crystalline silicon substrate 7, the front busbar 9 was printed with aluminum paste and dried. 5 front busbars 9 having a width of 0.5-3 mm (1 mm in this example) and a length of 154 mm were arranged equidistantly.

The treated N-type crystalline silicon substrate was conveyed into a conveyor belt sintering furnace for sintering at a sintering peak temperature of 900° C. After the sintering was complete, the manufacture of the N-type solar cell was finished.

The N-type solar cells prepared in Examples 1-3 and the comparative example were subjected to performance measurement, and the results are shown in Table 1:

TABLE 1

| Item | Line resistivity ($\Omega \cdot$ cm) | Short-circuit current (A) | Open-circuit voltage (V) | Fill factor % | Contact resistivity (m$\Omega \cdot$ cm$^2$) | Conversion efficiency % |
|---|---|---|---|---|---|---|
| Example 1 | $2.6 \times 10^{-6}$ | 9.25 | 0.6835 | 79.53 | 1.0 | 24.56% |
| Example 2 | $2.61 \times 10^{-6}$ | 9.18 | 0.6855 | 80.22 | 0.8 | 24.43% |
| Example 3 | $2.59 \times 10^{-6}$ | 9.00 | 0.6805 | 80.5 | 0.7 | 24.16% |
| Comparative Example | $3.01 \times 10^{-6}$ | 8.92 | 0.6735 | 76.53 | 2.5 | 22.89% |

The solar cell prepared according to the method for metallizing disclosed herein has a significantly reduced line resistance relative to that in the prior art, and has a greatly improved photoelectric conversion efficiency.

The present invention is not limited to the above-mentioned optimal embodiments, and any other various products may be obtained by anyone in light of the present invention. However, no matter what change in shape or structure thereof is made, all technical schemes that are identical or similar to those of the present invention will fall within the protection scope of the present invention.

What is claimed is:

1. A method for metallizing a front electrode of an N-type solar cell, comprising the following steps:
   (1) preparing an N-type double-sided cell comprising an N-type crystalline silicon substrate before metallization, and forming a p$^+$doped region and a front surface passivation anti-reflection coating on a front surface of the N-type crystalline silicon substrate in an inside-out sequence; and forming an n$^+$doped region and a rear surface passivation coating on a rear surface of the N-type crystalline silicon substrate in an inside-out sequence; and
   (2) printing an aluminum paste on the front surface passivation anti-reflection coating to form first fingers, overprinting a silver paste on the first fingers to form second fingers, and printing a front silver paste on the first fingers to form busbars,
   wherein the first fingers have a width of 20-33 μm and a height of 10-20 μm, and a distance between two adjacent first fingers is 0.8-1.5 mm,
   wherein the second fingers have a width of 30-50 μm and a height of 5-10 μm, and a distance between two adjacent second fingers is 0.8-1.5 mm,
   wherein the width of the second fingers is greater than the width of the first fingers, and the height of the second fingers is smaller than the height of the first fingers.

2. The method for metallizing the front electrode of the N-type solar cell according to claim 1, wherein the passivation anti-reflection coating on the front surface of the N-type crystalline silicon substrate comprises one or more of SiO$_2$, SiN$_x$, or Al$_2$O$_3$ dielectric coatings, and the rear surface passivation coating is a composite dielectric coating consisting of SiO$_2$ and SiN$_x$, dielectric coatings; the N-type crystalline silicon substrate has a thickness of 50-300 μm; the p$^+$doped region has a doping depth of 0.5-2.0 μm; the front surface passivation anti-reflection coating has a thickness of 70-110 nm; the rear surface passivation coating has a thickness of no less than 20 nm; the n$^+$doped region has a doping depth of 0.5-2.0 μm.

3. The method for metallizing the front electrode of the N-type solar cell according to claim 1, wherein the busbars have a width of 0.5-3 mm and a height of 5-10 μm.

4. The method for metallizing the front electrode of the N-type solar cell according to claim 1, wherein the front surface passivation anti-reflection coating is printed with the aluminum paste, dried at 200-300° C. for 2-5 min and sintered at a sintering peak temperature of 550-780° C. for 8-15 s to form the first fingers; the first fingers are overprinted with a low temperature-curing silver paste, dried at 100-200° C. for 5-10 min and cured at 150-250° C. for 3-5 min to form the second fingers.

5. The method for metallizing the front electrode of the N-type solar cell according to claim 1, wherein the front surface passivation anti-reflection coating is printed with the aluminum paste, dried at 200-300° C. for 2-5 min and sintered at a sintering peak temperature of 550-780° C. for 8-15 s to form the first fingers; the first fingers are overprinted with a low-to-medium temperature-curing silver paste, dried at 200-300° C. for 2-5 min and sintered at 300-500° C. for 8-15 min to form the second fingers.

6. The method for metallizing the front electrode of the N-type solar cell according to claim 1, wherein the front surface passivation anti-reflection coating is printed with the aluminum paste and dried at 200-300° C. for 2-5 min to form the first fingers; the first fingers are overprinted with a medium-to-high temperature-sintering silver paste, dried at 200-300° C. for 2-5 min and sintered at a sintering peak temperature of 700-780° C. for 8-15 min to form the second fingers.

7. The method for metallizing the front electrode of the N-type solar cell according to claim 1, wherein the printed front silver paste for forming the busbars and the printed front silver paste for forming the second fingers vary.

* * * * *